US007655576B2

(12) United States Patent
Ozaki et al.

(10) Patent No.: US 7,655,576 B2
(45) Date of Patent: Feb. 2, 2010

(54) INSULATOR FILM, MANUFACTURING METHOD OF MULTILAYER WIRING DEVICE AND MULTILAYER WIRING DEVICE

(75) Inventors: Shirou Ozaki, Kawasaki (JP); Yoshihiro Nakata, Kawasaki (JP); Ei Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/842,412

(22) Filed: Aug. 21, 2007

(65) Prior Publication Data
US 2008/0050933 A1 Feb. 28, 2008

(30) Foreign Application Priority Data
Aug. 21, 2006 (JP) .............................. 2006-224236
Jul. 4, 2007 (JP) .............................. 2007-176433

(51) Int. Cl.
*H01L 21/31* (2006.01)
*H01L 21/469* (2006.01)

(52) U.S. Cl. ........................ 438/781; 438/778; 438/780

(58) Field of Classification Search ................. 438/788, 438/781
See application file for complete search history.

(56) References Cited

U.S. PATENT DOCUMENTS 6,566,278 B1 * 5/2003 Harvey et al. ............... 438/778
7,132,171 B2 11/2006 Ohdaira et al.
2003/0064315 A1 * 4/2003 Choi et al. ............... 430/270.1
2005/0003213 A1 1/2005 Ohdaira et al.
2005/0194619 A1 9/2005 Edelstein et al.
2006/0128166 A1 * 6/2006 Nakata et al. ............... 438/795
2006/0128167 A1 6/2006 Nakata et al.
2006/0251825 A1 11/2006 Ohdaira et al.

FOREIGN PATENT DOCUMENTS

EP 1 482 550 A2 5/2004
JP 2006-190962 A 7/2006

OTHER PUBLICATIONS

German Office Action dated Feb. 5, 2009, issued in corresponding German patent application No. 10 2007 037 445.5-43.

* cited by examiner

*Primary Examiner*—Ha Tran T Nguyen
*Assistant Examiner*—Valerie Brown
(74) *Attorney, Agent, or Firm*—Westerman, Hattori, Daniels & Adrian, LLP

(57) ABSTRACT

In a method for manufacturing a semiconductor device, including forming an insulator film including a material having Si—$CH_3$ bond and Si—OH bond, and irradiating the insulator film with ultraviolet rays, the rate of decrease of C concentration by X-ray photoelectron spectroscopy is not more than 30%, and the rate of decrease of one or more bonds selected from the group consisting of C—H bond, O—H bond and Si—O bond of Si—OH is not less than 10%, as a result of ultraviolet ray irradiation. A low-dielectric-constant insulator film that has a high film strength and can prevent increase of dielectric constant due to moisture absorption, a semiconductor device that can prevent device response speed delay and reliability decrease due to parasite capacity increase, and a manufacturing method therefor are provided.

9 Claims, 10 Drawing Sheets

STEP FLOW 1

STEP FLOW 2

STEP FLOW 3

STEP FLOW 4

STEP FLOW 5

STEP FLOW 6

STEP FLOW 7

STEP FLOW 8

INSULATOR FILM, MANUFACTURING METHOD OF MULTILAYER WIRING DEVICE AND MULTILAYER WIRING DEVICE

CROSS-REFERENCE TO RELATED APPLICATIONS

This application is based upon and claims the benefit of priority from the prior Japanese Patent Application No. 2006-224236, filed on Aug. 21, 2006 and the prior Japanese Patent Application No. 2007-176433, filed on Jul. 4, 2007, the entire contents of which are incorporated herein by reference.

BACKGROUND OF THE INVENTION

1. Field of the Invention

The present invention relates to a multilayer wiring device and an insulator film thereof.

2. Description of the Related Art

A drop in the signal propagation speed by the increase of parasitic capacity of an insulator film for a semiconductor device has been known, but the line delay did not have a major influence on an entire device at the generation in which the line space of a semiconductor device exceeded 1 μm. But the influence on the device speed becomes major when the line space is 1 μm or less, and in particular the influence of the parasitic capacity between the lines on the device speed will be significant if circuits are formed with a 0.1 μm or less line space in the future.

Specifically, as the degree of integration of semiconductor integrated circuits increases and device density improves, the demand for multilayer semiconductor elements is increasing, particularly. In this trend, the line space is becoming smaller, for example, due to the higher degree of integration, and the line delay caused by the increase of capacity between lines is becoming a problem. The line delay (T) is influenced by the line resistance (R) and the capacity between lines (C), and is given by the following Formula 1.

$$T \propto CR \quad (1)$$

In Formula 1, the relationship of ∈ (dielectric constant) and C is shown in Formula 2.

$$C = \epsilon_0 \epsilon_r S/d \quad (2)$$

(where S is an electrode area, ∈0 is the dielectric constant of a vacuum, ∈r is the dielectric constant of an insulator film, and d is a line space.) Therefore in order to decrease the line delay, decreasing the dielectric constant of an insulator film is effective.

Currently, low-dielectric-constant coating-type insulator films, etching stopper layers formed by plasma CVD, and diffusion-barrier insulator films are mainly used as insulator films in the multilayer wiring structures of multilayer wiring devices such as semiconductor devices.

Traditionally, films of inorganic materials such as silicon dioxide ($SiO_2$), silicon nitride (SiN), phosphorus silicon glass (PSG), etc., or organic polymers such as polyimides have been used for these insulators. However, CVD-$SiO_2$ films most frequently used for semiconductor devices have a specific dielectric constant as high as about 4. Although SiOF films which have been investigated as a low-dielectric-constant CVD film show a specific dielectric constant of about 3.3-3.5, they are highly hygroscopic, resulting in increase of the dielectric constant. In addition, in recent years, as low-dielectric-constant films, porous coatings are becoming known which are obtained by addition of organic resins or the like that are evaporated or decomposed by heating, into materials for low-dielectric-constant films, followed by heating during the film forming to make them porous. However, they have poor mechanical strength generally due to the porosity. Because the current pore size is as large as not less than 10 nm, if the porosity is increased so as to decrease the dielectric constant, the increase of dielectric constant due to moisture absorption as well as decrease of film strength tend to occur.

To solve these problems, processes have been investigated in which an insulator film after film formation is cured by ultraviolet rays, plasma beams or electron beams in order to provide the film with a higher strength. However, increase of dielectric constant and film thickness thinning of the insulator films due to elimination of organic groups (mainly $CH_3$ group) tend to occur in any of the processes, providing insufficient results. Processes have been also investigated in which a high-density insulator film is formed on a porous insulator film, over which ultraviolet rays, plasma beams or electron beams are irradiated as a trial to suppress such damage and increase the film strength while maintaining a low dielectric constant (References 1 and 2).

Reference 1: Japanese Patent Application 2004-356618 (claims)

Reference 2: Japanese Patent Application 2005-235850 (claims)

SUMMARY OF THE INVENTION

According to one aspect of the present invention, provided is a method for manufacturing a multilayer wiring device, including forming an insulator film including a material having Si—$CH_3$ bond and Si—OH bond, and modifying the insulator film by irradiating the insulator film with ultraviolet rays through a filter, wherein: as the filter, a filter is used that provides a property that the rate of decrease of C concentration of the insulator film by X-ray photoelectron spectroscopy is not more than 30%, and the rate of decrease of one or more bonds selected from the group consisting of C—H bond, O—H bond and Si—O bond of Si—OH in the insulator film is not less than 10%, as a result of ultraviolet ray irradiation.

It is preferable that the ultraviolet rays that have passed through the filter have one or more peaks having a property that the rate of decrease of C concentration by X-ray photoelectron spectroscopy is not more than 30%, and the rate of decrease of one or more bonds selected from the group consisting of C—H bond, O—H bond and Si—O bond of Si—OH is not less than 10%, as a result of ultraviolet ray irradiation.

According to another aspect of the present invention, provided is a method for manufacturing a multilayer wiring device, including forming an insulator film including a material having Si—$CH_3$ bond and Si—OH bond, and modifying the insulator film by irradiating the insulator film with ultraviolet rays through a filter, wherein: as the filter, a filter is used that provides a property that the rate of decrease of contact angle of the insulator film is not more than 8%, and the rate of decrease of one or more bonds selected from the group consisting of C—H bond, O—H bond and Si—O bond of Si—OH in the insulator film is not less than 10%, as a result of ultraviolet ray irradiation.

It is preferable that the ultraviolet rays that have passed through the filter have one or more peaks having a property that the rate of decrease of contact angle of the insulator film is not more than 8%, and the rate of decrease of one or more bonds selected from the group consisting of C—H bond, O—H bond and Si—O bond of Si—OH in the insulator film is not less than 10%, as a result of ultraviolet ray irradiation.

Regarding both aspects, it is preferable that the method includes forming Si—CH$_2$—CH$_2$—Si bond and Si—CH$_2$—Si bond in the insulator film through the ultraviolet ray irradiation.

According to still another aspect of the present invention, provided is a method for manufacturing a multilayer wiring device, including forming an insulator film including a material having Si—CH$_3$ bond and Si—OH bond, and modifying the insulator film by irradiating the insulator film with ultraviolet rays, the method including: forming Si—CH$_2$—CH$_2$—Si bond and Si—CH$_2$—Si bond in the insulator film by the ultraviolet ray irradiation. It is preferable that the method includes irradiating the ultraviolet rays through a filter.

Also, regarding all the above-described three aspects, it is preferable that the method includes forming Si—O—Si bond in the insulator film by the ultraviolet ray irradiation; that the ultraviolet rays that have passed through the filter have a cumulative illumination intensity in the longer wavelength range not shorter than 320 nm that is not more than 136% of a cumulative illumination intensity in the wavelength range not longer than 320 nm, and the ultraviolet rays have at least one peak in the range not longer than 320 nm; that the method includes performing heat treatment at a temperature in the range of 50-470° C. during the ultraviolet ray irradiation; and that the method includes performing ultraviolet ray irradiation after another insulator film has been formed over the insulator film through which ultraviolet rays can pass to reach the insulator film.

According to these aspects of the present invention, it is possible to obtain a multilayer wiring device having a low-dielectric-constant insulator film that has a high film strength and can prevent increase of its dielectric constant due to moisture absorption. By this, it is possible to prevent delay in the device response speed caused by parasite capacity increase in the multilayer wiring device as well as the decrease of its device reliability. It is also possible to improve the yield and provide a multilayer wiring device with higher reliability, by restraining thermal history through a filter which cuts wavelengths which are not necessary for the ultraviolet ray curing.

According to still another aspect of the present invention, provided is a modified insulator film obtained by forming an insulator film including a material having Si—CH$_3$ bond and Si—OH bond, and irradiating the insulator film with ultraviolet rays through a filter, wherein: as the filter, a filter is used that provides a property that the rate of decrease of C concentration of the insulator film by X-ray photoelectron spectroscopy is not more than 30%, and the rate of decrease of one or more bonds selected from the group consisting of C—H bond, O—H bond and Si—O bond of Si—OH in the insulator film is not less than 10%, as a result of ultraviolet ray irradiation.

It is preferable that the ultraviolet rays that have passed through the filter have one or more peaks having a property that the rate of decrease of C concentration by X-ray photoelectron spectroscopy is not more than 30%, and the rate of decrease of one or more bonds selected from the group consisting of C—H bond, O—H bond and Si—O bond of Si—OH is not less than 10%, as a result of ultraviolet ray irradiation.

According to still another aspect of the present invention, provided is a modified insulator film obtained by forming an insulator film including a material having Si—CH$_3$ bond and Si—OH bond, and irradiating the insulator film with ultraviolet rays through a filter, wherein: as the filter, a filter is used that provides a property that the rate of decrease of contact angle of the insulator film is not more than 8%, and the rate of decrease of one or more bonds selected from the group consisting of C—H bond, O—H bond and Si—O bond of Si—OH in the insulator film is not less than 10%, as a result of ultraviolet ray irradiation.

It is preferable that the ultraviolet rays that have passed through the filter have one or more peaks having a property that the rate of decrease of contact angle of the insulator film is not more than 8%, and the rate of decrease of one or more bonds selected from the group consisting of C—H bond, O—H bond and Si—O bond of Si—OH is not less than 10%, as a result of ultraviolet ray irradiation.

Furthermore, regarding the directly above two aspects of modified insulator films, it is preferable that the modified insulator film includes Si—CH$_2$—CH$_2$—Si bond and Si—CH$_2$—Si bond formed in the insulator film through the ultraviolet ray irradiation.

According to still another aspect of the present invention, provided is a modified insulator film, obtained by forming an insulator film including a material having Si—CH$_3$ bond and Si—OH bond, and forming Si—CH$_2$—CH$_2$—Si bond and Si—CH$_2$—Si bond in the insulator film by ultraviolet ray irradiation of the insulator film. It is preferable that the ultraviolet rays are irradiated through a filter.

Regarding all the above-described aspects of modified insulator films, it is preferable that the modified insulator film includes an Si—O—Si bond formed in the insulator film; that the ultraviolet rays that have passed through the filter have a cumulative illumination intensity in the longer wavelength range not shorter than 320 nm that is not more than 136% of a cumulative illumination intensity in the wavelength range not longer than 320 nm, and the ultraviolet rays have at least one peak in the range not longer than 320 nm; that the modified insulator film has been subjected to heat treatment at a temperature in the range of 50-470° C. during the ultraviolet ray irradiation; and that the modified insulator film has been subjected to ultraviolet ray irradiation after another insulator film has been formed over the insulator film through which ultraviolet rays can pass to reach the insulator film.

By the above-described aspects of modified insulator films of the present invention, it is possible to obtain a low-dielectric-constant insulator film that has a high film strength and can prevent increase of dielectric constant due to moisture absorption. It is also possible to decrease negative effects caused by the heat to the components that are present together, by restraining thermal history through a filter that cuts the wavelengths which are not necessary for the ultraviolet ray curing.

According to still another aspect of the present invention, provided is a multilayer wiring device manufactured by the above-described method for manufacturing a multilayer wiring device, and a multilayer wiring device including the above-described modified insulator film. It is also possible to improve the yield and provide a multilayer wiring device with higher reliability, by restraining thermal history through cutting of the wavelengths which are not necessary for the ultraviolet ray curing.

By these multilayer wiring device aspects of the present invention, it is possible to obtain a multilayer wiring device that can prevent delay in the device response speed as well as the decrease of its device reliability.

By the present invention, it is possible to obtain a low-dielectric-constant insulator film that has a high film strength and can prevent increase of dielectric constant due to moisture absorption. By this, it is possible to decrease the parasite capacity generated between wiring lines, in the multilayered wiring process of a multilayer wiring device, and to prevent delay in the device response speed and decrease of reliability due to increased parasite capacity, in multilayer wiring devices represented by highly integrated semiconductor devices such as IC and LSI. The present invention is particularly useful for circuit boards, etc. that require higher response speed.

EXPLANATION OF MARKS

Figure 1A:
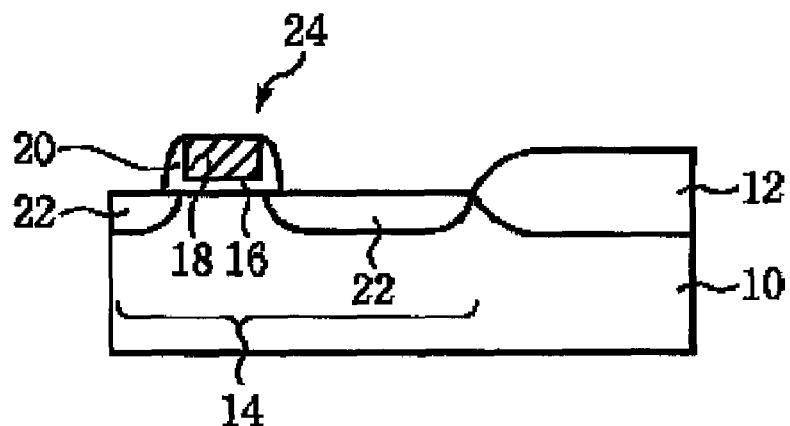
FIGS. 1-8 are each a schematic cross-sectional view of a multilayer wiring device during manufacture in order to explain examples and comparative examples of the present invention.

| 10 | Semiconductor substrate | | |
|---|---|---|---|
| 12 | Element separation film | | |
| 14 | Element domain | 16 | Insulator film |
| 18 | Gate electrode | 20 | Side wall insulator film |
| 22 | Source/drain diffusion layer | | |
| 24 | Transistor | 26 | Interlayer insulator film |
| 28 | Stopper film | | |
| 30 | Contact hole | 32 | Adhesion layer |
| 34 | Conductor plug | 36 | Interlayer insulator film |
| 38 | Interlayer Insulator film | | |
| 40 | Interlayer Insulator film | | |
| 42 | Photoresist film | | |
| 44 | Opening | 46 | Groove |
| 48 | Laminated film | | |
| 50 | Wiring line | 52 | Interlayer insulator film |
| 54 | Interlayer Insulator film | | |
| 56 | Interlayer Insulator film | | |
| 58 | Interlayer Insulator film | | |
| 60 | Interlayer Insulator film | | |
| 62 | Photoresist film | | |
| 64 | Opening | 66 | Contact hole |
| 68 | Photoresist film | | |
| 70 | Opening | 72 | Groove |
| 74 | Laminated film | 76 | Cu film |
| 76a | Wiring line | 76b | Conductor plug |
| 78 | Interlayer insulator film | | |

DESCRIPTION OF THE PREFERRED EMBODIMENTS

In the following, embodiments of the present invention will be explained using drawings, tables, formulae, examples, etc. The drawings, tables, formulae, examples, etc. as well as the explanations are for the purpose of illustrating the present invention, and do not limit the scope of the present invention. It goes without saying that other embodiments can be in the category of the present invention, as long as they conform to the gist of the present invention.

When an insulator film including a material having Si—$CH_3$ bond and Si—OH bond is manufactured in a multilayer wiring device, the insulator film is often modified and cured by irradiation of active energy rays such as ultraviolet rays. However, problems occur that Si—OH bond is generated due to scission of Si—C bond of Si—$CH_3$ by the active energy ray irradiation, causing decrease of moisture resistance and increase of dielectric constant of the insulator film. There are also other problems that the temperature of the substrate is increased by the irradiation of active energy rays such as ultraviolet rays so that the thermal history would cause decreasing of the yield as well as the reliability of LSI, depending on the temperature experienced.

As a result of investigation, it was found that in the ultraviolet rays, there are wavelength ranges that give a property that the rate of decrease of C concentration of the insulator film by X-ray photoelectron spectroscopy is not more than 30%, and the rate of decrease of one or more bonds selected from the group consisting of C—H bond, O—H bond and Si—O bond of Si—OH in the insulator film is not less than 10%, as a result of ultraviolet ray irradiation; that it is possible to provide a high strength to an insulator film while maintaining its low dielectric constant, and to maintain moisture resistance when such wavelength ranges are utilized; and that it is useful to utilize a filter having a specific property for ultraviolet ray irradiation in order to realize these wavelength ranges, and facilitate to achieve a high strength at a low temperature while restraining the rise of substrate temperature. It is also possible to substantially prevent the decrease of C concentration (as will be explained later, this is considered to mean substantially preventing scission of Si—C bond of $SiCH_3$), and at the same time, achieve the scission of one or more bonds selected from the group consisting of C—H bond, O—H bond and Si—O bond of Si—OH. Here, substantially preventing the decrease of C concentration (that is, substantially preventing scission of Si—C bond) refers to a fact that the rate of decrease of C concentration by the X-ray photoelectron spectroscopy is not more than 15%.

The reason of being able to make the strength of an insulator film high while maintaining a low dielectric constant, or to maintain its moisture resistance when such a wavelength range or a filter is used, is considered to be that the decrease of C concentration by the X-ray photoelectron spectroscopy means the decrease of Si—C bond of Si—$CH_3$, and if the decrease of Si—C bond of Si—$CH_3$ is suppressed it is possible to suppress the increase of its hygroscopic properties due to generation of Si—OH bond, and will be able to increase chances for cross-linking (curing) by taking out hydrogen from $CH_3$, resulting in a high film strength. If scission of C—N bond, O—H bond and Si—O bond of Si—OH occurs, it may also increase chances of cross-linking that leads to increase of the film strength. Furthermore, scission of O—H bond and Si—O bond of Si—OH may increase the moisture resistance. In other words, it is important to make the scission of one or more bonds selected from the group consisting of C—H bond, O—H bond and Si—O bond of Si—OH in preference to the scission of Si—C bond of Si—$CH_3$.

In other words, according to the first aspect of the present invention, provided is a method for manufacturing a multilayer wiring device, including forming an insulator film including a material having Si—$CH_3$ bond and Si—OH bond, and modifying the insulator film by irradiating the insulator film with ultraviolet rays through a filter, wherein: as the filter, a filter is used that provides a property that the rate of decrease of C concentration of the insulator film by X-ray photoelectron spectroscopy is not more than 30%, and the rate of decrease of one or more bonds selected from the group consisting of C—H bond, O—H bond and Si—O bond of Si—OH in the insulator film is not less than 10%, as a result of ultraviolet ray irradiation. It is preferable that the rate of decrease of C concentration is not more than 15%, or the rate of decrease of one or more bonds selected from the group consisting of C—H bond, O—H bond and Si—O bond of Si—OH is not less than 20%. It is more preferable that both the conditions are satisfied.

Accordingly, it is possible to obtain a low-dielectric-constant insulator film that has a high film strength and can prevent increase of dielectric constant due to moisture absorption. When this insulator film is used, it is possible to decrease the parasite capacity generated between wiring lines in a multilayer wiring device, and to prevent delay in a device response speed and decrease of reliability due to increase of parasite capacity. Therefore, a multilayer wiring device using this insulator film will be able to respond to the demand of higher response speed.

Whether a filter can provide a property of making the rate of decrease of C concentration determined by X-ray photoelectron spectroscopy not larger than a certain value, and/or a property of making the rate of decrease of one or more bonds selected from the group consisting of C—H bond, O—H bond and Si—O bond of Si—OH not smaller than a certain value, as a result or ultraviolet ray irradiation, can be determined in the following way.

First, the time change in the C concentration (carbon concentration, atom %) is determined, using XPS (X-ray photoelectron spectroscopy). The change in the C concentration in this case may be determined arbitrarily. It may be determined by obtaining a relationship with the concrete value of the concentration. Also, since it is a relative value, it is often suitable to determine it through peak heights of spectra, areas of spectra or other similar values that can be used as indices.

The rate of decrease of one or more bonds selected from the group consisting of C—H bond, O—H bond and Si—O bond of Si—OH is determined similarly. There is no particular limitation to the measuring method in this case, and any known method may be employed. FT-IR (Fourier transform infrared spectroscopy), XPS, and combination of FT-IR and XPS may be applied. It is to be noted here that insulator films that are prepared in the same conditions as those actually applied may be used as the insulator films which are the objects for the measurements. Those insulator films that are prepared in the conditions that simulate the conditions actually applied may also be used as the insulator films which are the objects for the measurements.

The rate of decrease of bonds in such a case may be determined by concrete concentration values. Also since it is a relative value, it is often suitable to determine it through peak heights of spectra, areas of spectra or other similar values that can be used as indices.

The following indicates an example of analysis using FT-IR and XPS. In this case, it is possible first to observe that the Si—C bond of Si—CH$_3$ bond has been severed, by measuring the change of C concentration through XPS. This utilizes the fact that when the Si—C bond in Si—CH$_3$ bond is severed, the C concentration is decreased because C does not stay inside the film, and is discharged out of the film.

For example, if a value of 8 atom % prior to ultraviolet ray irradiation results in a value of 6 atom % after a certain time period of the irradiation, (8−6)/8=0.25, that is, the rate of decrease is 13%.

Next, the ratios of Si—CH$_3$ peak intensity (in the neighborhood of 1,276 cm$^{-1}$) obtained by FT-IR to film thickness (nm) are calculated before and after a certain time of ultraviolet irradiation. Then, by comparing the values, it is possible to determine how much the Si—CH$_3$ bond in the film is decreased through the ultraviolet irradiation.

For example, supposed the ratio of a peak intensity (in the neighborhood of 1,276 cm$^{-1}$) of Si—CH$_3$ bond to a thickness (nm) is 85 (/mm) before ultraviolet irradiation and 50 (/mm) after a certain time of the ultraviolet irradiation, the rate of decrease is (85−50)=0.4, or the rate of decrease is 40%.

The decrease of Si—CH$_3$ bond includes decrease of Si—C bond and C—H bond. Therefore, the rate of decrease of C—H bond is calculated as 40−13=27%.

If a irradiation time that satisfies the requirements according to the present invention is found in this way, it results in providing ultraviolet rays that satisfy the requirements according to the present invention. If some time range of irradiation satisfies the requirements according to the present invention, it is possible to select a suitable time as appropriate.

It is desirable that the ultraviolet rays that have passed through a filter have one or more peaks having a property that the rate of decrease of C concentration of the insulator film by X-ray photoelectron spectroscopy is not more than 30%, and the rate of decrease of one or more bonds selected from the group consisting of C—H bond, O—H bond and Si—O bond of Si—OH in the insulator film is not less than 10%, as a result of ultraviolet ray irradiation. In other words, it has been found that, in ultraviolet rays, there are a plurality of peaks having a property that the rate of decrease of C concentration by X-ray photoelectron spectroscopy is not more than 30%, and the rate of decrease of one or more bonds selected from the group consisting of C—H bond, O—H bond and Si—O bond of Si—OH is not less than 10%, as a result of ultraviolet ray irradiation. Specifically, they are peaks in the neighborhood of 220, 260, 280, and 300 nm. It is preferable to utilize such a peak, or choose a filter to utilize such a peak.

Furthermore, in the course of the investigation of the present invention, it was found that the contact angle of the insulator film of interest decreased. This may also be due to the decrease of the Si—C bond of Si—CH$_3$. Thus, the second aspect of the present invention employs a condition of "the rate of decrease of contact angle of the insulator film is not more than 8%" instead of the condition of "the decrease of C concentration by X-ray photoelectron spectroscopy is not more than 30%", in the above-described conditions. The same may be applied to the ultraviolet ray peaks. In this case, the condition to correspond to the above-described condition of "the decrease of C concentration by X-ray photoelectron spectroscopy is not more than 15%" is "the rate of decrease of contact angle of the insulator film is not more than 5%". The method for measuring the contact angle of an insulator film may be selected from any known methods.

According to the third aspect of the present invention, it has been found that a modified insulator film formed by forming an insulator film including a material having Si—CH$_3$ bond and Si—OH bond, and modifying the insulator film by irradiating the insulator film with ultraviolet rays in order to form Si—CH$_2$—CH$_2$—Si bond and Si—CH$_2$—Si bond in the insulator film is useful as a low-dielectric-constant insulator film that has a high film strength and can prevent increase of the dielectric constant due to moisture absorption.

This is considered to be due to the fact that the moisture resistance and film strength are increased while the low dielectric constant is maintained, as a result that the Si—C bond of Si—CH$_3$ is not much severed, and changes into Si—CH$_2$—CH$_2$—Si bond and/or Si—CH$_2$—Si bond, and the Si—O bond of Si—OH is severed into Si—CH$_2$—CH$_2$—Si bond and/or Si—CH$_2$—Si bond. In the case when the filter as described above was used, also, the formation of Si—CH$_2$—CH$_2$—Si bond and Si—CH$_2$—Si bond in the insulator film was actually recognized.

In this aspect of the present invention, it is possible to achieve a desirable effect by selecting the type of ultraviolet rays for use. It is also useful to use a filter. The filter may also be selected appropriately from among filters for ultraviolet rays.

Figure 10:
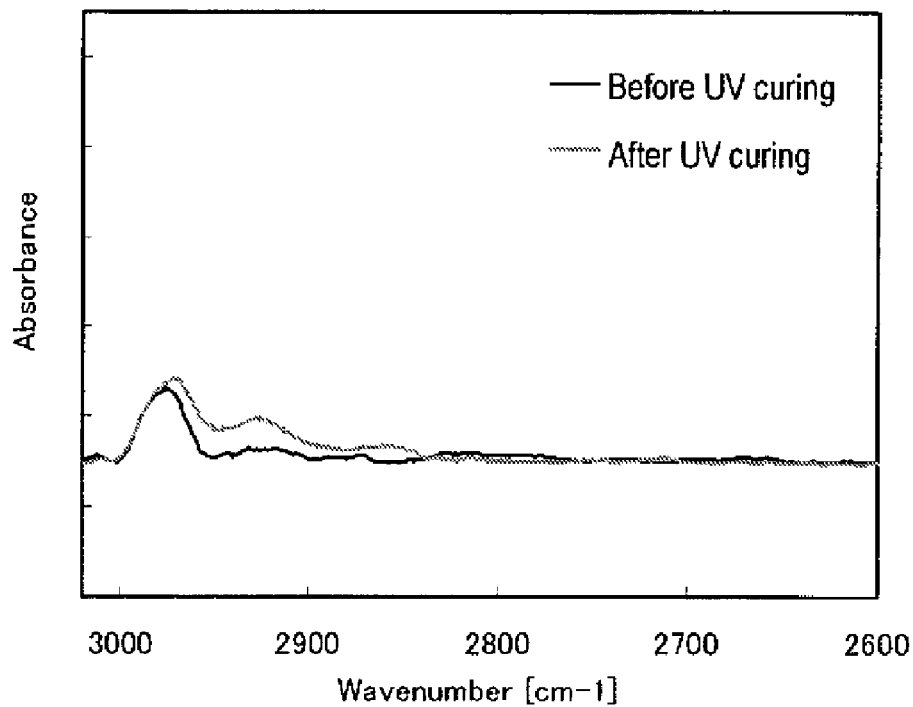
FIG. 10 is an exemplary FT-IR spectrum.

Si—CH₂—CH₂—Si bond and Si—CH₂—Si bond may also be detected by FT-IR. The FT-IR spectrum in FIG. 10 shows that peaks based on —CH₂— appears near 2850 cm⁻¹ and 2925 cm⁻¹ through ultraviolet ray irradiation, from which it can be confirmed that Si—CH₂—CH₂—Si bond and Si—CH₂—Si bond are formed in the insulator film. Other methods such as XPS may also be employed for the measurement. If Si—CH₂—CH₂—Si bond and/or Si—CH₂—Si bond is detected by such an analytical method, it is possible to decide that the Si—CH₂—CH₂—Si bond and/or Si—CH₂—Si bond is formed.

It is also preferable to combine the first or second aspect with the third aspect, or combine the first, second and third aspects. In any case, it is also preferable that the above-described modified insulator film is obtained by forming Si—O—Si bond, because of its contribution to the film strength and increase of the moisture resistance on the basis of the same reasons as above. The Si—O—Si bond may also be detected by FT-IR. Other methods such as XPS may also be employed.

It is considered that the bond formation of the Si—CH₂—CH₂—Si, Si—CH₂—Si and Si—O—Si bonds proceeds as shown in the following formulae.

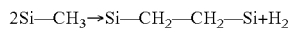

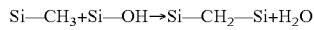

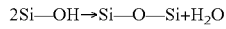

A modified insulator film according to the present invention means an insulator film that has been subjected to a treatment for modification with ultraviolet rays. In other words, modification according to the present invention means a treatment with ultraviolet rays. Any insulator film may be included in the category of this insulator film, as long as it does not contradict the gist of the present invention. As specific examples, an insulator film, an insulator layer, an interlayer film, an interlayer insulator film, an interlayer insulator layer, a cap layer, an etching stopper layer, and the like can be enumerated. The modified insulator film according to the present invention may also sometimes has some functions other than insulating function, such as a function to prevent migration of wiring metals, etc., a function of etching stopper, etc. A plurality of modified insulator films according to the present invention may be installed in one multilayer wiring device.

The insulator film according to the present invention may be formed from a starting material that is an arbitrarily selected insulator film including a material containing Si—CH₃ bond and Si—OH bond before ultraviolet ray irradiation.

There is no particular limit on the material having Si—CH₃ bond and Si—OH bond, and can be selected from any known materials. Typically, what is called silicon type insulator film falls under this category. There is no particular limit on how much the material having Si—CH₃ bond and Si—OH bond is contained. It is practical to select an appropriate material on the basis whether a desirable result is achieved or not, as a result of performing the present invention. Whether Si—CH₃ bond and Si—OH bond are present or not in a material, may be confirmed by any method. FT-IR is an example.

Such an insulator film usually has pores inside the film. Carbon Doped SiO₂ films that are formed by a vapor-phase growth method, Porous Carbon Doped SiO₂ films that have pores formed by adding a thermally decomposable compound to a Carbon Doped SiO₂ film, porous silica-type material films formed by a spin coat method, and organic porous films are specific examples. Porous silica-type material films formed by a spin coat method are preferable from a viewpoint of controlling the pores and density.

Examples of porous silica-type materials formed by such a spin coat method are those formed by adding a thermally decomposable organic compound or the like to a polymer, followed by heating to form small pores, the polymer having been formed by hydrolysis/polycondensation of, for example, tetraalkoxy silane, trialkoxysilane, methyltrialkoxysilane, ethyltrialkoxysilane, propyltrialkoxysilane, phenyltrialkoxysilane, vinyltrialkoxysilane, allyltrialkoxysilane, glycidyltrialkoxysilane, dialkoxysilane, dimethyldialkoxysilane, diethyldialkoxysilane, dipropyldialkoxysilane, diphenyldialkoxysilane, divinyldialkoxysilane, diallyldialkoxysilane, diglycidyldialkoxysilane, phenylmethyldialkoxysilane, phenylethyldialkoxysilane, phenylpropyltrialkoxysilane, phenylvinyldialkoxysilane, phenylallyldialkoxysilane, phenylglycidyldialkoxysilane, methylvinyldialkoxysilane, ethylvinyldialkoxysilane, propylvinyldialkoxysilane, etc. Those obtained by using a cluster-shaped porous silica-type precursor formed with a quaternary alkyl amine are more preferable. It is because they have pores that are small and uniform in pore size.

There is no limitation on the ultraviolet rays according to the present invention as long as the main concept of the present invention is not violated. There is no limitation on the filter according to the present invention, either. However, porous insulting films from a common silicon compound has an absorption wavelength range which is not longer than 320 nm, it is important for the ultraviolet rays to have a wavelength range of not longer than 320 nm. It is because the effects of suppressing the rate of decrease of C concentration by X-ray photoelectron spectroscopy to a value not more than a specific value, and making the rate of decrease of one or more bonds selected from the group consisting of C—H bond, O—H bond and Si—O bond of Si—OH not less a specific value grow larger. The specificity of the formation of Si—CH₂—CH₂—Si bond and Si—CH₂—Si bond grows larger, too. It is possible to achieve this condition by using a filter.

Ultraviolet rays in a wavelength range exceeding 320 nm may be present. However, it is often preferable that the rays are in a smaller amount because it results in heating the object for the ultraviolet ray irradiation unnecessarily. The comparison of the amount of ultraviolet rays in the wavelength range not longer than 320 nm and the amount of ultraviolet rays in the wavelength range exceeding 320 nm can be comprehended by the ratio of the cumulative illumination intensity of ultraviolet rays in the wavelength range not longer than 320 nm to the cumulative illumination intensity of ultraviolet rays in the wavelength range not shorter than 320 nm. It is to be noted that the expression "not shorter than 320 nm" is employed in the calculation of the cumulative illumination intensity of ultraviolet rays. This is to make it possible to determine the cumulative illumination intensities of ultraviolet rays as concrete figures, and accordingly, the definition does not contradict the spirit of "the comparison of the amount of ultraviolet rays in the wavelength range not longer than 320 nm and the amount of ultraviolet rays in the wavelength range exceeding 320 nm". The cumulative illumination intensity in the longer wavelength range not shorter than 320 nm is preferably not more than 136% of the cumulative illumination intensity in the wavelength range not longer than 320 nm. A plurality of filters may be used in combination. Since an insulator film including material having Si—CH₃ bond and Si—OH bond as shown in the ultraviolet ray spectrum of FIG. 9 generally has an ultraviolet absorption band of not longer than 320 nm, it is preferable for the ultraviolet rays to have at least one peak in the range of not longer than 320 nm. Other conditions such as the intensity and irradiation time of the ultraviolet rays may be appropriately determined through experiments, etc. Because the rate of decrease of C concentration and the rate of decrease of C—H bond, O—H bond and Si—O bond of Si—OH may change according to these conditions, it is important to also investigate these conditions when filters and ultraviolet rays are employed.

It is preferable to perform the ultraviolet ray irradiation in vacuo or under a reduced pressure. During the treatment, inactive gas such as nitrogen, helium, argon or the like, may be introduced to control the pressure and/or for the modification. It is also preferable to perform a heat treatment at a temperature in the range of 50 to 470° C. during the ultraviolet ray irradiation. This is because the curing of the insulator film is promoted, facilitating the increase of the film strength, and when a base insulator film is present, the adhesion between the insulator film and base insulator film can be enhanced. It is more preferable to perform the heat treatment at a temperature in the range of 300 to 400° C.

The heat treatment may be carried out at a constant temperature. It may also be carried out with gradual or step-wise changing of the temperature. The gradual or step-wise changing of the temperature is preferable because it can facilitate cross-linking of the interlayer insulator film while maintaining the pore size uniform. The heat treatment may be carried out before and/or after the ultraviolet ray irradiation. Ultraviolet ray irradiation without heat treatment may also be carried out.

In addition, at least one of EB (electron beams) irradiation and plasma irradiation may be carried out together with the ultraviolet ray irradiation or with the ultraviolet ray irradiation and heat treatment. Effects such as shorter treatment time may be achieved. The duration of the EB irradiation and/or plasma irradiation may coincide with the duration of the ultraviolet ray irradiation an/or heat treatment, or not.

As long as the requirements of the aspects of the present invention are satisfied, the ultraviolet rays need not be directly irradiated on the insulator film according to the present invention. Such a condition may occur when another insulator film is further formed on an insulator film according to the present invention. This is because the requirements for the aspects of the present invention are satisfied, as long as this "another insulator film" is ultraviolet-ray transparent. In this way, adhesion between the insulator films may be enhanced, and simplified steps such as those realized by combining plural steps (such as heating steps) into one step may be achieved. Besides, there are some cases in which it works favorably for the requirements of the aspects of the present invention. This is considered to be caused by the "another insulator film" probably acting as a filter. There is no particular limit on the material used for the "another insulator film", except the ultraviolet ray-transparency. Here, it is to be noted that the term "ultraviolet ray-transparent" in the above description means that the condition is satisfied if only transmitted ultraviolet rays are present, and it is not necessary to transmit all the ultraviolet rays. It is also not necessary to transmit substantially all the ultraviolet rays in a specific wavelength range.

If such "another insulator film" is utilized, it is preferable to form the "another insulator film" following a heat treatment after formation of an insulator film according to the present invention. More specifically, it is preferable to perform the heat treatment under a condition that the rate of cross-linking measured by infrared spectroscopy is not less than 10%. The temperature range may be appropriately selected. Generally, 50 to 450° C. is preferable. This heat treatment can be called pre-bake to distinguish it from the above-described heat treatments. The pre-bake is performed to prevent the insulator film according to the present invention from dissolving when the "another insulator film" is applied or treated in a similar way. The cross-linking rate of less than 10% may dissolve the insulator film according to the present invention. There is no particular upper limit, but when it is over 90%, cracks tend to be generated on the insulator film. It is also possible that the "another insulator film" is subjected to heat treatment before ultraviolet ray irradiation.

A modified insulator film thus obtained can have a high strength while maintaining a low dielectric constant, and also can maintain its moisture resistance. It is also possible to decrease negative effects caused by the heat to the components that are present together, by restraining thermal history through a filter that cuts the wavelengths which are not necessary for the ultraviolet ray curing. It is possible to integrate into a method for manufacturing a multilayer wiring device, the modified insulator film and the method for manufacturing the above-described modified insulator film. With a multilayer wiring device thus obtained, it is possible to prevent the delay of device response speed and a fall of reliability due to parasite capacity increase which occurs in the course of the multilayer wiring formation process. Such a multilayer wiring device is particularly useful for circuit boards, etc. for which speedup of response speed is demanded. There is no particular limit on the method for manufacturing such a multilayer wiring device, except that the above-described modified insulator film and the method for manufacturing the above-described modified insulator film are integrated into the method.

EXAMPLES

The following explanation will be made with reference to EXAMPLES 1-17 and COMPARATIVE EXAMPLES 1-6 of the present invention, as well as FIGS. 1-8. The curing with ultraviolet rays and evaluation were carried out as follows.

(Curing with Ultraviolet Rays)

Figure 11:
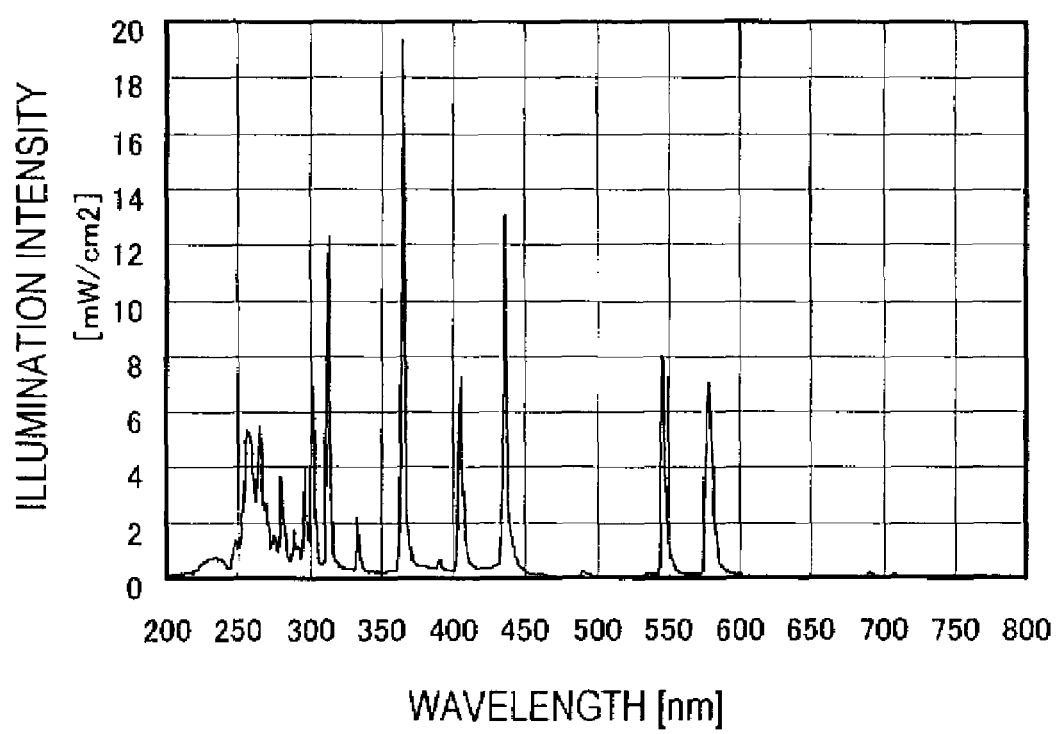
FIG. 11 is an emission spectrum of a high-pressure mercury lamp (UVL-7000H4-N, Ushio electric Inc.).

A high-pressure mercury lamp (UVL-7000H4-N, Ushio electric Inc.) having a light-emission spectrum as shown in FIG. 11 was used for curing with ultraviolet rays. The illumination intensity and spectral distribution of ultraviolet rays were measured with a spectroradiometric illumination meter (USR-40D, Ushio electric Inc.).

(Ultraviolet Ray Spectrum)

Figure 9:
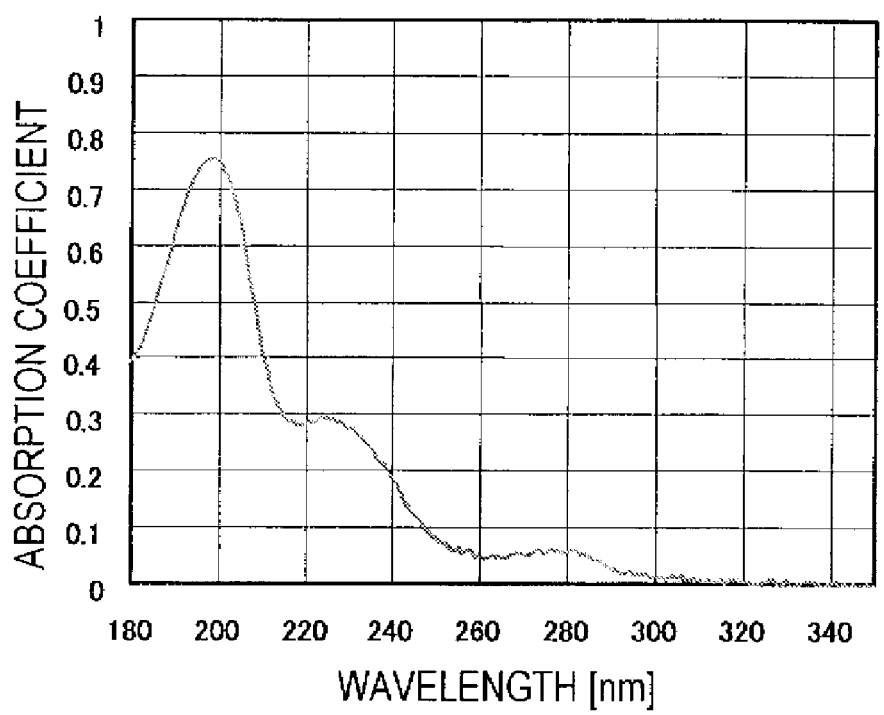
FIG. 9 is an ultraviolet absorption spectrum of a porous insulator film of a common silicon compound.

The ultraviolet ray spectrum of an insulator film as shown in FIG. 9 was determined by measuring the ultraviolet ray spectrum of the insulator film in the range of 180-350 nm with a vacuum ultraviolet spectrometer (SGV-157, Shimadzu Corporation), the film having been formed on a quartz substrate.

(Specific Dielectric Constant)

A gold electrode having a diameter of 1 mm was formed on an interlayer insulator film, using a resistance heating type vacuum deposition device (VPC-1100, ULVAC). The specific dielectric constant was calculated through capacity measurement using an LCR meter (HP-4284A, HP).

(Effective Specific Dielectric Constant)

After a pattern was formed on an Si substrate, the effective specific dielectric constant was calculated through capacity measurement using the LCR meter (HP-4284A, HP).

(Film Strength)

The film strength was measured with a nanoindenter (Nanoinstruments Corporation).

(Si—CH₃ Absorption Intensity/Film Thickness [/min])

The peak intensity of each bond was measured through measurement of the transmission spectrum with an infrared spectrometer {Nippon bunko (JASCO Corporation), JIR-100}, and the ratios of the existing amounts of bonds were quantified by taking the ratios of the peak intensities to the sample film thicknesses (nm).

(C Concentration [Atom %] in a Film)

The C concentration in a film was measured with an X-ray photoelectron analyzer (AXIS-HSi, KRATOS ANALYTICAL Ltd.).

(Contact Angle)

The contact angle of water was measured with a full-automatic contact angle meter (CA-W150, Kyowa InterFACE Science Co., LTD.).

Examples 1-7 and Comparative Examples 1-6

First, an element separation film 12 was formed on a semiconductor substrate 10 by the LOCOS (Local Oxidation of Silicon) method, as shown in FIG. 1. An element domain 14 was defined by the element separation film 12. A silicon substrate was used as the semiconductor substrate 10.

Next, a gate electrode 18 was formed over the element domain 14 with an insulator film 16 therebetween. Then, a side wall insulator film 20 was formed on the sides of the gate electrode 18. Next, a source/drain diffusion layer 22 was formed in a semiconductor substrate 10 on the both sides of the gate electrode 18, by introducing dopant impurities into the semiconductor substrate 10 with the side wall insulator film 20 and the gate electrode 18 as masks. A transistor 24 having the gate electrode 18 and the source/drain diffusion layer 22 was formed in this way {(see FIG. 1(a)}.

Next, an interlayer insulator film 26 made of silicon oxide film was formed all over the surface by CVD.

Next, a stopper film 28 having a film thickness of 50 nm was formed on the interlayer insulator film 26. As a material for the stopper film 28, an SiN film formed by a plasma CVD method was used. The stopper film 28 was to act as a stopper in the polishing by a CMP method of a tungsten film 34 or the like in the steps later described. The stopper film 28 was also to act as an etching stopper when forming grooves 46 in an interlayer insulator film 38 or the like in the steps later described.

Figure 1B:
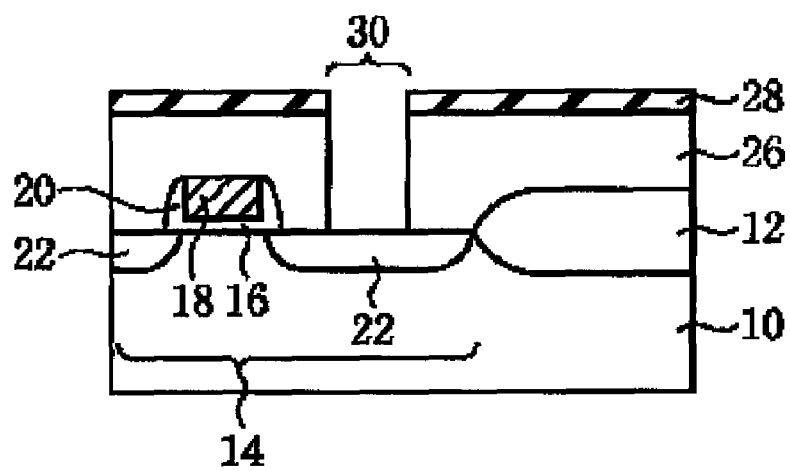
Figure 1C:
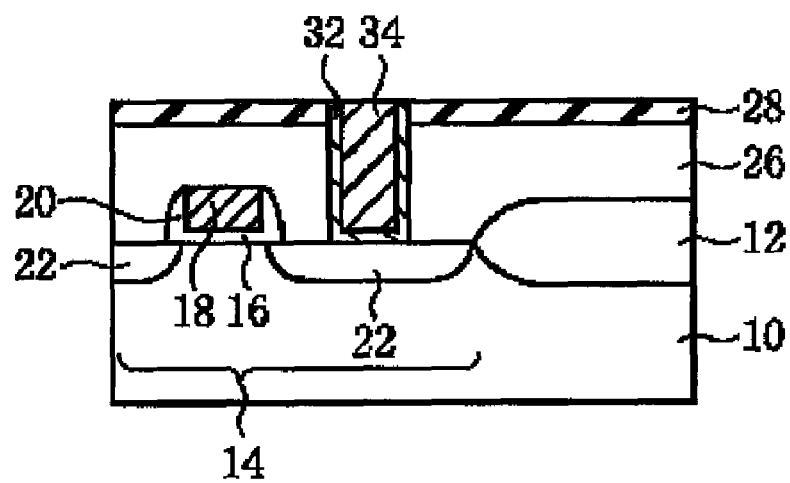

Next, a contact hole 30 was formed to reach the source/drain diffusion layer 22 by applying photolithography {see FIG. 1(b)}.

Next, a layer made of TiN film having a film thickness of 50 nm to form an adhesion layer 32 was formed all over the surface by sputtering. It is to be noted that the adhesion layer 32 is a layer to secure adhesion between conductor plugs and its underlayer that will be described later.

Next, a layer made of tungsten having a film thickness of 1 μm to form conductor plugs 34 was formed all over the surface by CVD.

Next, the layers to form the adhesion layer 32 and conductor plugs 34 were polished by CMP until the surface of the stopper film 28 was exposed. In this way, the conductor plugs 34 surrounded by the adhesion layer 32 were formed as embedded in the contact holes {see FIG. 1(c)}.

Figure 2A:
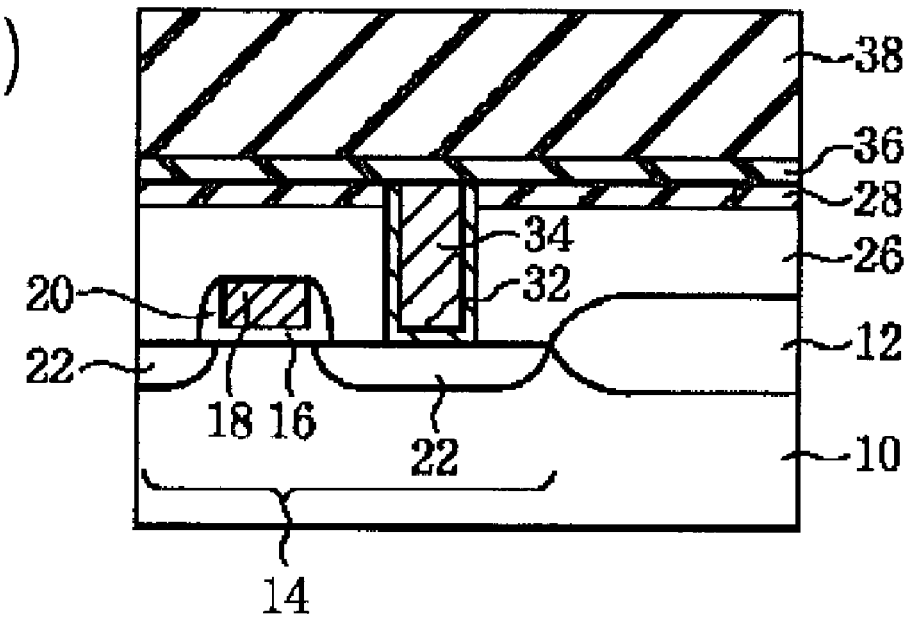

Next, an interlayer insulator film 36 (made of SiO₂) having a film thickness of 30 nm was formed by CVD as shown in FIG. 2(a).

Next, an interlayer insulator film 38 made of porous silica (porous silica 819C) was formed all over the surface as shown in FIG. 2(a). The film thickness of the interlayer insulator film 38 was made to be 160 nm. The presence of Si—CH₃ bond and Si—OH bond in the interlayer insulator film 38 was confirmed by FT-IR. In EXAMPLES 1-7, the interlayer insulator film 38 is an example of an insulator film according to the present invention.

Next, the interlayer insulator film 38 was irradiated with ultraviolet rays under conditions of TABLES 1 and 2 to perform ultraviolet ray curing. The substrate temperature was maintained at a constant value of 400° C. during the curing.

Figure 2B:
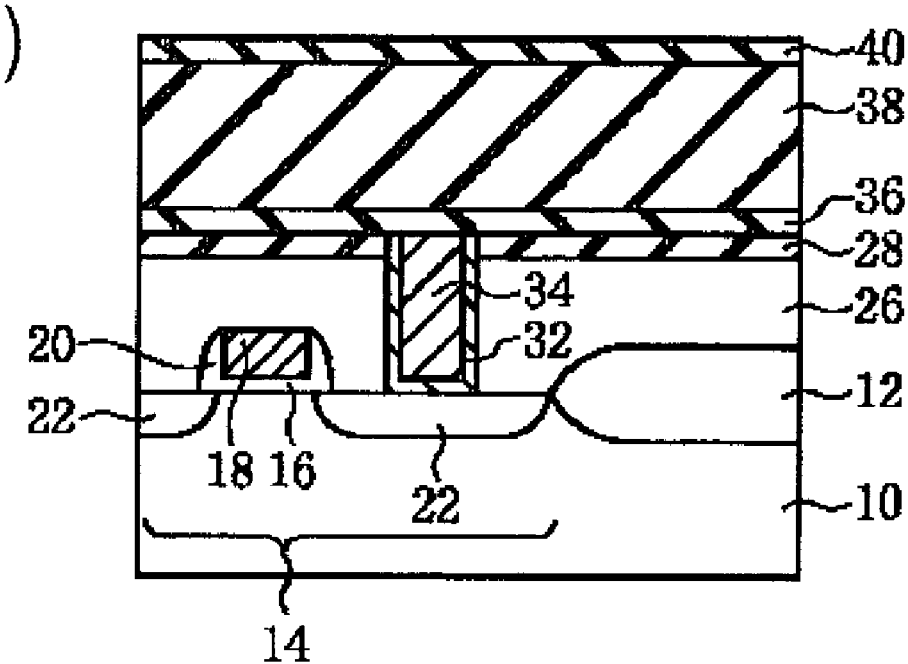

Next, an interlayer insulator film 40 (made of SiO₂) having a film thickness of 30 nm was formed by CVD as shown in FIG. 2(b).

Next, a photoresist film 42 was formed all over the surface by a spin coat method.

Next, a pattern of openings 44 was formed in the photoresist film 42 by photolithography. The openings 44 were formed to form wiring lines for a first layer (first layer wiring lines) 50. The openings 44 were formed so that the wiring line width was 100 nm, and the space between two wiring lines was 100 nm.

Figure 3A:
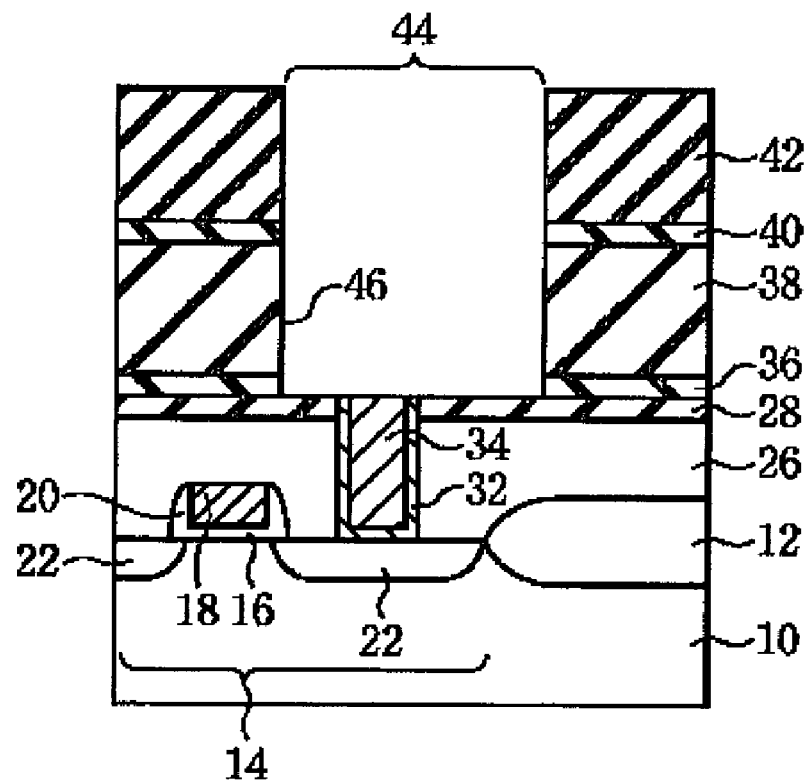

The interlayer films 40, 38 and 36 were subjected to etching, with the photoresist film 42 as a mask {see FIG. 3(a)}. A fluorine plasma formed by using a CF₄ gas and CHF₃ gas as raw materials, was used for the etching. The stopper film 28 acted as an etching stopper during the etching. In this way, grooves (trenches) 46 for embedding wiring lines were formed in the interlayer insulator films 40, 38 and 36. The upper surface of the conductor plugs 34 was exposed in the grooves 46. After that, the photoresist film 42 was peeled off.

Next, a layer (not shown) made of TaN having a film thickness of 10 nm to form a barrier film was formed all over the surface by a sputtering method. The barrier film was formed for preventing diffusion of Cu in wiring lines that will be described later into the insulator film. Next, a layer (not shown) made of Cu having a film thickness of 10 nm to form a seed film was formed all over the surface by a sputtering method. The seed film was formed to act as an electrode in the course of forming a layer for forming wiring lines made of Cu by an electroplating method. In this way, a laminated film 48 consisting of the barrier film and a layer for forming seed film was formed.

Next, a Cu layer (layer for forming wiring lines 50) having a film thickness of 600 nm was formed by an electroplating method.

Next, the above-described Cu layer and laminated film 48 were subjected to CMP polishing until the surface of the insulator film was exposed. In this way, the wiring lines 50 made of Cu were embedded in the grooves as were surrounded by the laminated film 48. Such a process for manufacturing wiring lines 50 is called a single damascene method.

Figure 3B:
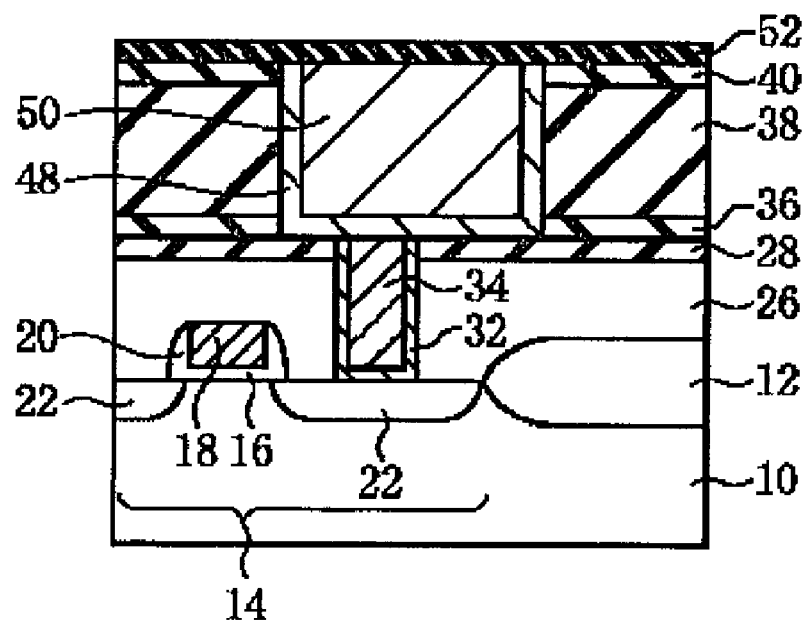

Next, an interlayer insulator film 52 having a film thickness of 30 nm was formed by CVD, as shown in FIG. 3(b).

Figure 4A:
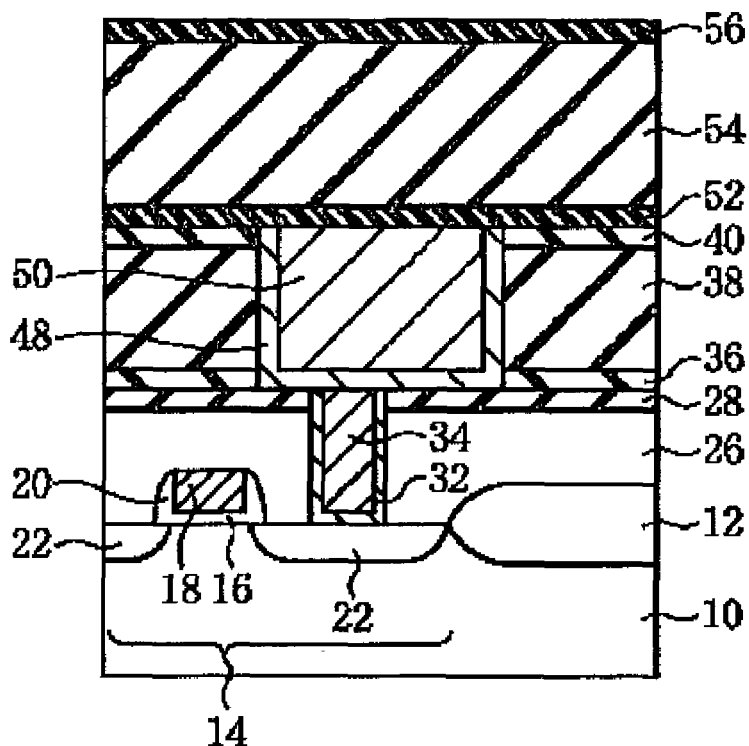

Next, a porous interlayer insulator film 54 was formed all over the surface as shown in FIG. 4(a). The material and manufacturing method for the porous interlayer insulator film 54 were the same as those for the above-described porous interlayer insulator film 38. The film thickness of the porous interlayer insulator film 54 was made to be 180 nm. The presence of Si—CH₃ bond and Si—OH bond in the interlayer insulator film 54 was confirmed by FT-IR. In EXAMPLES 1-7, the interlayer insulator film 54 is also an example of an insulator film according to the is present invention.

Next, the interlayer insulator film 54 was irradiated with ultraviolet rays under conditions of TABLE 1 and 2 to perform ultraviolet ray curing. The substrate temperature was maintained at a constant value of 400° C. during the curing.

Figure 4B:
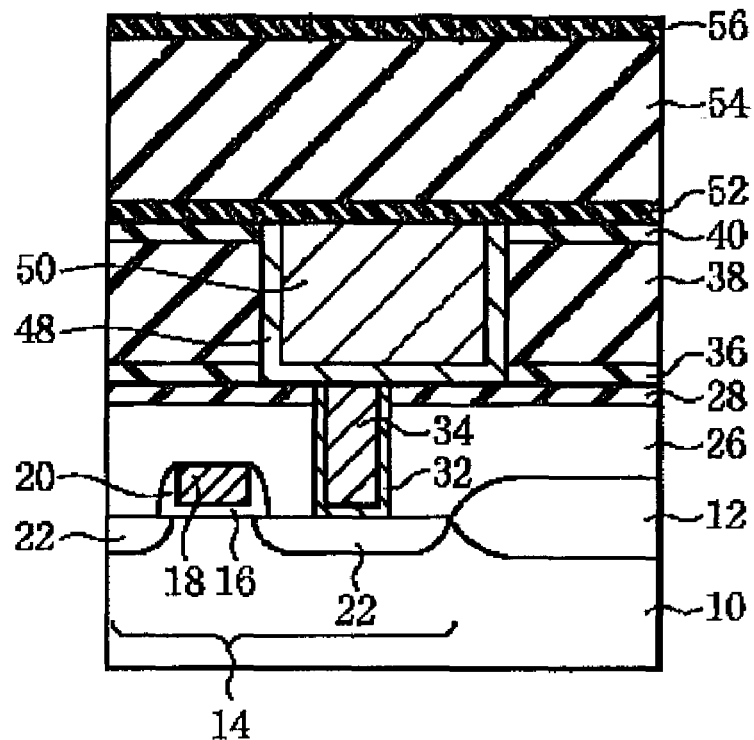

Next, an interlayer insulator film 56 having a film thickness of 30 nm was formed by CVD as shown in FIG. 4(b).

Figure 5A:
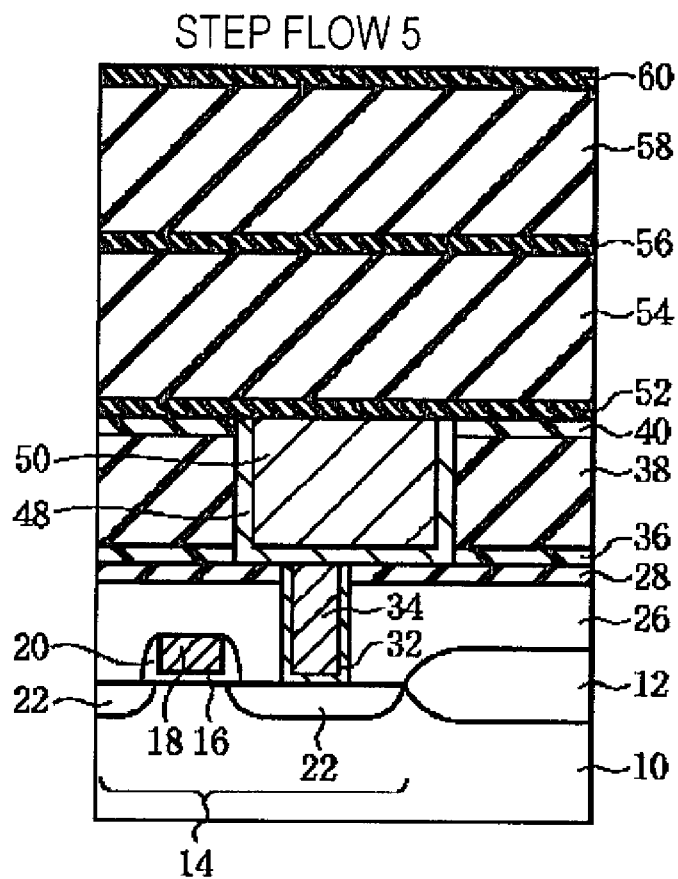

Next, a porous interlayer insulator film 58 was formed as shown in FIG. 5(a). The material and manufacturing method for the porous interlayer insulator film 58 were the same as those for the above-described porous interlayer insulator film 38. The film thickness of the interlayer insulator film 58 was made to be 160 nm. In EXAMPLES 1-7, the interlayer insulator film 58 is also an example of an insulator film according to the present invention.

Next, the interlayer insulator film 58 was irradiated with ultraviolet rays under conditions of TABLE 1 and 2 to perform ultraviolet ray curing. The substrate temperature was maintained at a constant value of 400° C. during the curing.

Figure 5B:
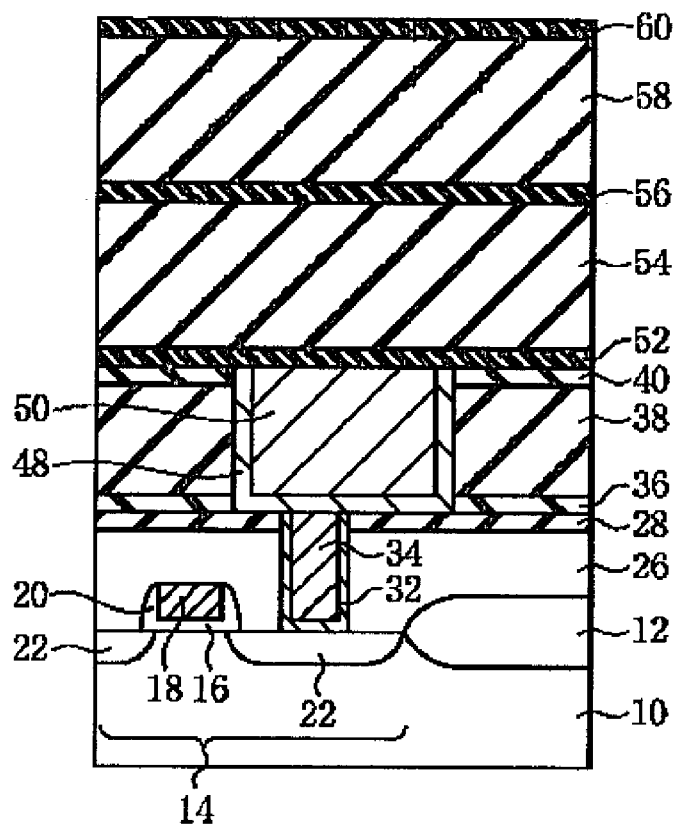

Next, an interlayer insulator film 60 (made of $SiO_2$) having a film thickness of 30 nm was formed by CVD as shown in FIG. 5(b).

Next, a photoresist film 62 was formed all over the surface by a spin coat method.

Figure 6:
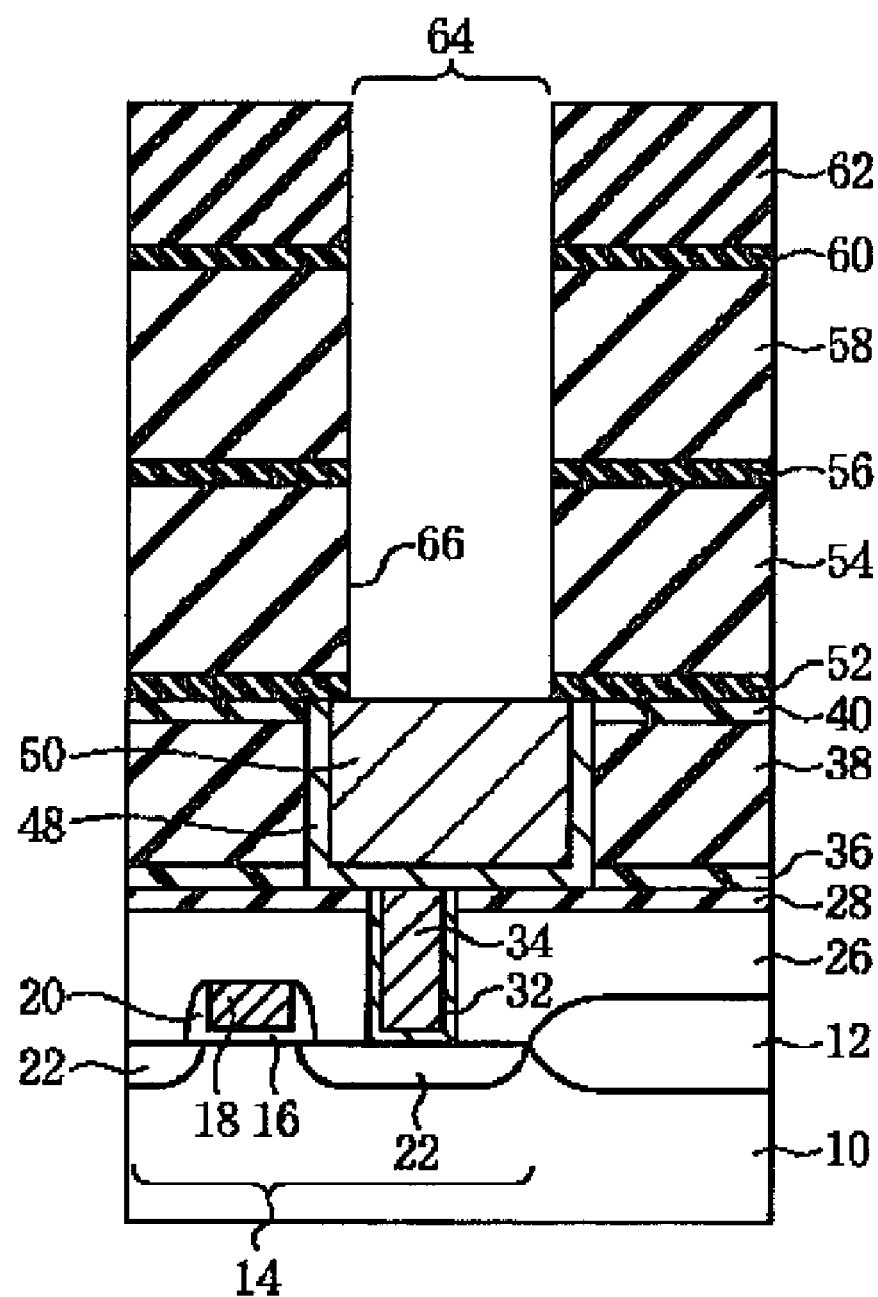

Next, openings 64 were formed in the photoresist film 62 by photolithography, as shown in FIG. 6. The openings 64 were formed to form contact holes 66 to reach the wiring lines 50.

Next, the interlayer insulator films 60, 58, 56, 54 and 52 were subjected to etching, with the photoresist film 62 as a mask. A fluorine plasma formed by using a $CF_4$ gas and $CHF_3$ gas as raw materials, was used for the etching. It was possible to carry out etching of the interlayer insulator films 60, 58, 56, 54 and 52 by appropriately changing the compositional ratio of the etching gas, the pressure during the etching, etc. In this way, the contact holes 66 to reach the wiring lines 50 were formed. After that, the photoresist film 62 was peeled off.

Next, a photoresist film 68 was formed all over the surface by a spin coat method.

Figure 7:
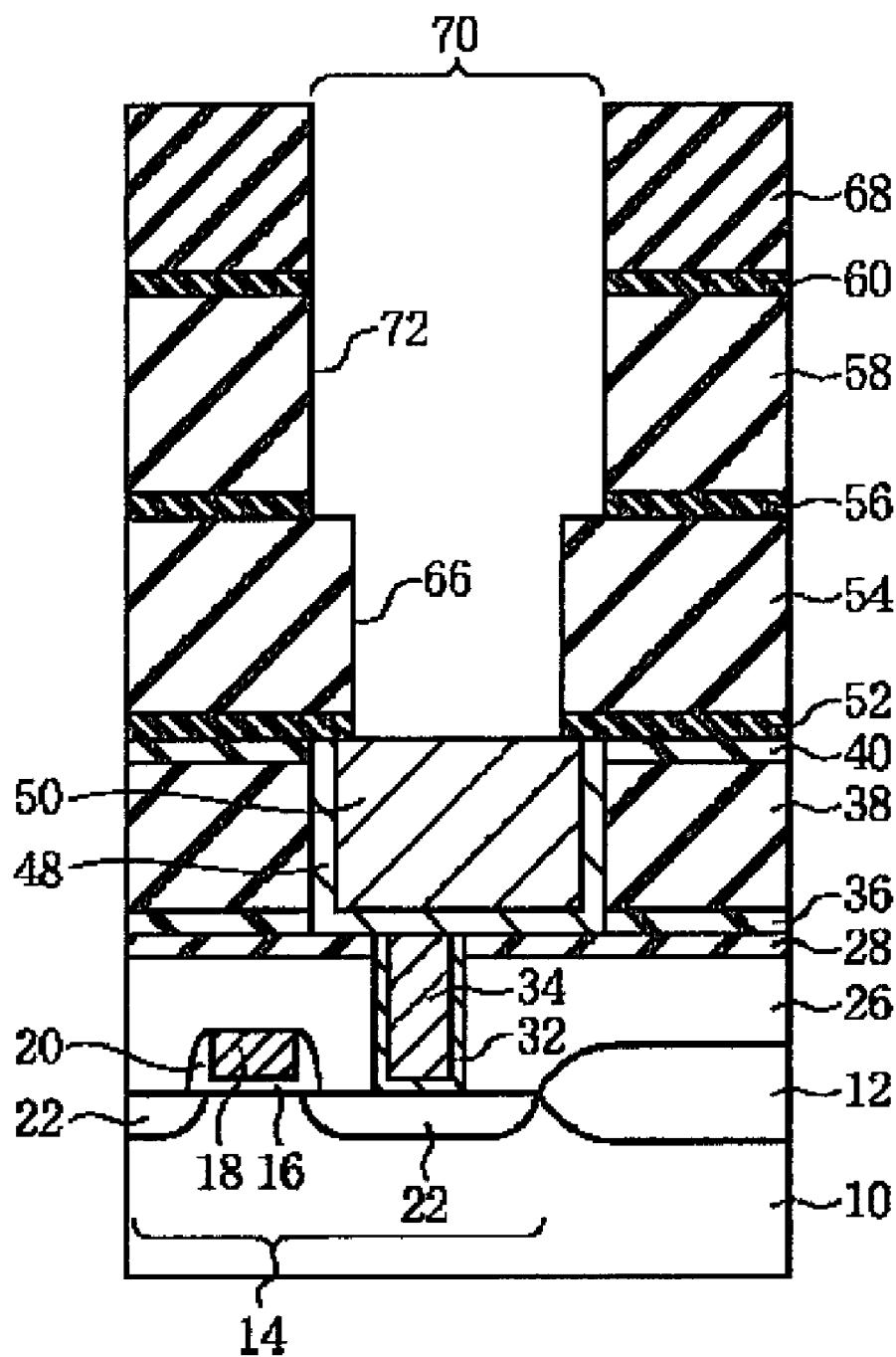

Next, openings 70 were formed in the photoresist film 68 by photolithography, as shown in FIG. 7. The openings 70 were formed to form a second layer for wiring lines (second layer wiring lines) 76a.

Next, the interlayer insulator films 60, 58, and 56 were subjected to etching, with the photoresist film 68 as a mask. A fluorine plasma formed by using a $CF_4$ gas and $CHF_3$ gas as raw materials, was used for the etching. In this way, grooves 72 were formed to embed the wiring lines 76a in the interlayer insulator films 60, 58, and 56. The grooves 72 were in a state connected to the contact holes 66.

Next, a layer (not shown) made of TaN having a film thickness of 10 nm to form a barrier film was formed all over the surface by a sputtering method. The barrier film was formed for preventing diffusion of Cu in the wiring lines 76a and conductor plugs 76b that will be described later. Next, a layer (not shown) made of Cu having a film thickness of 10 nm to form a seed film was formed all over the surface by a sputtering method. The seed film was formed to act as an electrode in the course of forming a layer made of Cu to form the wiring lines 76a and conductor plugs 76b by an electroplating method. In this way, a laminated film 74 consisting of the barrier film and a layer for forming seed film was formed.

Next, a Cu film 76 having a film thickness of 1,400 nm was formed by an electroplating method.

Next, the Cu film 76 and laminated film 74 were subjected to CMP polishing until the surface of the interlayer insulator film 60 was exposed. In this way, the conductor plugs 76 made of Cu were embedded in the contact holes 66, and at the same time, the wiring lines 76a made of Cu were embedded in the grooves 72. The conductor plugs 76b and wiring lines 76a were formed integrally. Such a manufacturing process in which the conductor plugs 76b and wiring lines 76a are formed together is called a dual damascene method.

Figure 8:
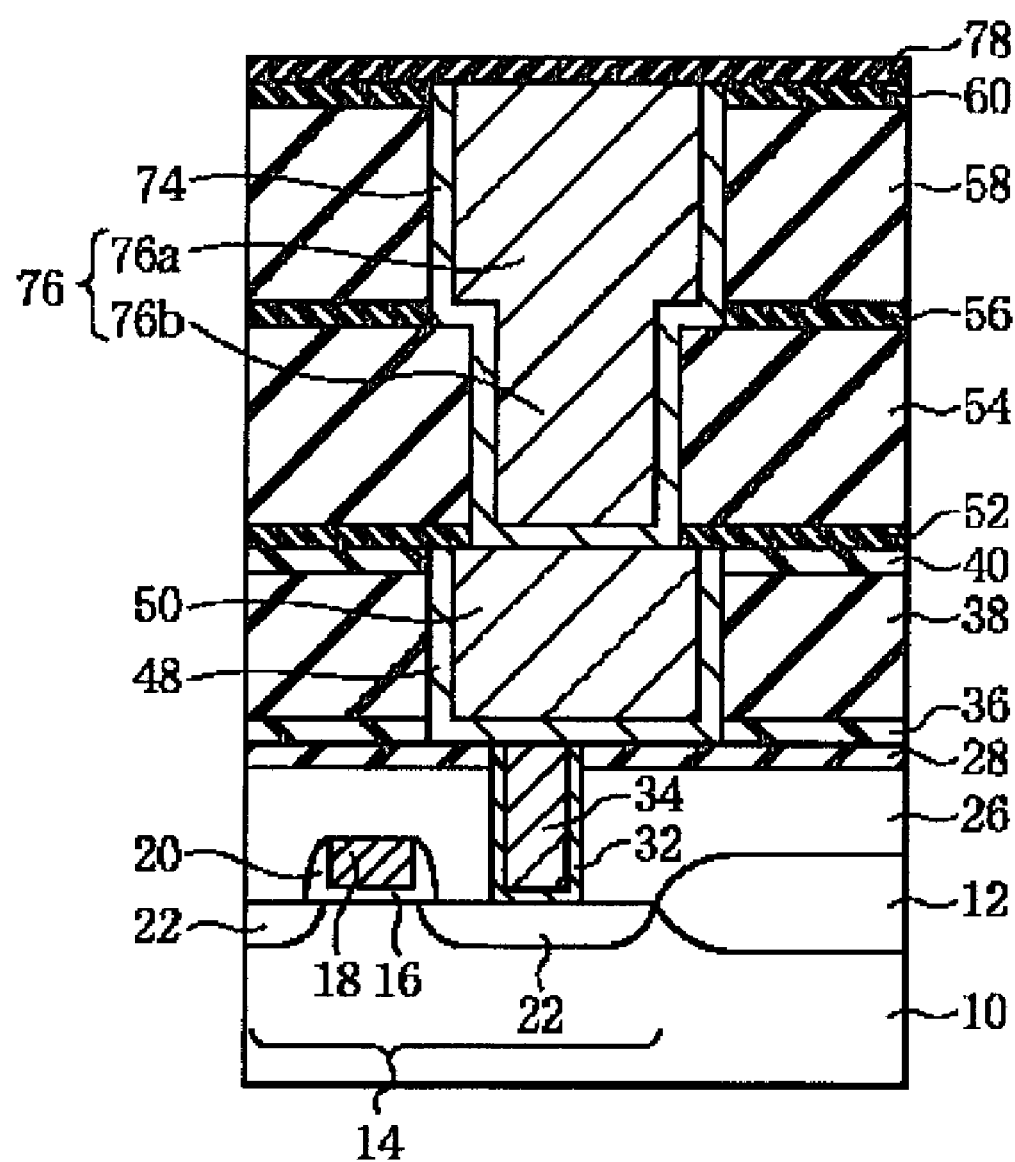

Next, an interlayer insulator film 78 (made of $SiO_2$) having a film thickness of 30 nm was formed by CVD, as shown in FIG. 8.

After that, by appropriately repeating steps similar to those above, third layer wiring lines (third metallic wiring lines) (not shown) were formed.

Using semiconductor devices formed in this way, wiring lines and conductor plugs were formed to electrically serially connect 1,000,000 conductor plugs, in order to determine the production yield. The yields were from 94.7 to 96.1% for EXAMPLES 1-7. The calculated effective specific dielectric constants between two wiring lines were from 2.6 to 2.7.

In contrast, the yields were from 51.1 to 96.1% for COMPARATIVE EXAMPLES 1-6. The calculated effective specific dielectric constants between two wiring lines were from 2.7 to 3.2.

It is to be noted here that the effective specific dielectric constant is a specific dielectric constant that is of a whole semiconductor device determined in a state where other insulator films are also present around the wiring lines, together with the porous interlayer insulator films. Because not only porous interlayer insulator films having low specific dielectric constants but also insulator films having relatively high specific dielectric constants are present around the wiring lines during the measurement, the effective specific dielectric constant is larger than the specific dielectric constant of a porous interlayer insulator film.

In TABLE 1, as ultraviolet rays for use, those having wavelength peaks shown in respective columns with a+10 nm range obtained by passing ultraviolet rays through appropriate filters were used. It was confirmed by using FT-IR, XPS, etc. in the experiments performed in the course of the manufacture of semiconductor devices or in model experiments that were carried out separately that EXAMPLES 1-7 satisfied the requirements for the first to third aspects of the present invention, and they had Si—O—Si bond formed in the insulator film, and that COMPARATIVE EXAMPLES 1-6 did not satisfy the requirements for the first to third aspects of the present invention.

The results are shown in TABLES 1 and 2. It is understood that in the EXAMPLES, the changes of the C concentration were small, and the changes of the Si—$CH_3$ absorption intensity/film thickness were large, and in response to these results, the results of film strengths, specific dielectric constants and effective specific dielectric constants were good. It is also understood that, in contrast, in COMPARATIVE EXAMPLES 1-3, the changes of the C concentration were large, and in response to this result, the results of specific dielectric constants and effective specific dielectric constants were poor as compared with those in the EXAMPLES; and in COMPARATIVE EXAMPLES 4 and 5, although the changes of the C concentration were small, the changes of the Si—$CH_3$ absorption intensity/film thickness were also small, and in response to these results, they were inferior in the film strength, even though the results of specific dielectric constants and effective specific dielectric constants were on the same level as those of the EXAMPLES.

In COMPARATIVE EXAMPLES 1-3, the changes of the C concentration were larger as compared with the changes of the Si—$CH_3$ absorption intensity/film thickness. It is considered that this was because the changes of the C concentration and the changes of the Si—$CH_3$ absorption intensity/film thickness did not always reflect the real changes. In other words, it is considered that when the rate of decrease of C concentration as well as the rate of decrease of one or more bonds selected from the group consisting of C—H bond, O—H bond and Si—O bond of Si—OH are referred to in the present invention, it is possible, if the combinations disclosed in the present invention are employed, to obtain a low-dielectric-constant insulator film that has a high film strength, and can prevent increase of dielectric constant due to moisture absorption, even if the real changes may not possibly be represented as in the cases of COMPARATIVE EXAMPLES 1-3.

It is to be noted that the specific dielectric constants in TABLES 1 and 2 are those determined during the production of semiconductor devices. The film strengths in TABLES 1 and 2 were also determined during the production of semiconductor devices. One semiconductor device had three insulator films that were either according to the present EXAMPLES or those for the comparison. As the material, ultraviolet ray irradiation conditions, and heating conditions were the same, the measurements of specific dielectric constant and film strength were carried out only for insulator film 38. COMPARATIVE EXAMPLE 6 did not use ultraviolet ray irradiation and accordingly, did not use any filter. Therefore, the values of the C concentration and Si—CH$_3$ absorption intensity/film thickness can be taken as those before the ultraviolet ray irradiation according to the present invention.

Furthermore, in order to see the effect of the cumulative illumination intensity of ultraviolet rays, experiments were carried out under the conditions listed in TABLES 3 and 4. The ultraviolet ray irradiation was defined by the ratio of a cumulative illumination intensity in the longer wavelength range not shorter than 320 nm to the cumulative illumination intensity in the wavelength range not longer than 320 nm as shown in TABLE 3, which was different from the case of TABLE 1.

The conditions which were not related to the items not listed in TABLES 3 and 4 were the same as those for the cases of TABLES 1 and 2. It was confirmed by using FT-IR. XPS, etc. through experiments carried out during the production of semiconductors or model experiments carried out separately that the requirements according to the first to third aspects of the present invention were satisfied for EXAMPLES 8-17, and Si—O—Si bond was generated in the insulator films.

As a result, EXAMPLES 8-13 showed high yields of 94.7 to 96.1% together with good specific dielectric constants as shown in TABLES 3 and 4. However, EXAMPLES 14-17 showed lower yields of 51.1 to 71.1% while the specific dielectric constants were still good. This suggests a negative effect by the thermal history caused by ultraviolet rays in the long wavelength range not shorter than 320 nm.

As explained as above, the present invention can provide a low-dielectric-constant insulator film that has a high film strength and can prevent the increase of dielectric constant due to moisture absorption. It is also possible to improve the yield and provide a multilayer wiring device with higher reliability, by restraining thermal history through a filter that cuts wavelengths which are not necessary for the ultraviolet ray curing. The present invention is particularly useful for circuit boards, etc. for which speedup of response speed is required.

TABLE 1

| | UV wavelength [nm] | Ratio of cum. int. (%)* | Specific dielectric constant | Film strength [GPa] | Si—CH$_3$ absorption intensity [/mm] |
|---|---|---|---|---|---|
| EX. 1 | 220 | 13 | 2.4 | 16 | 50 |
| EX. 2 | 260 | 43 | 2.3 | 16 | 52 |
| EX. 3 | 280 | 52 | 2.3 | 16 | 54 |
| EX. 4 | 300 | 55 | 2.3 | 15 | 53 |
| EX. 5 | 340 | 68 | 2.3 | 15 | 55 |
| EX. 6 | 360 | 73 | 2.3 | 14 | 60 |
| EX. 7 | 370 | 86 | 2.3 | 14 | 68 |
| COMP. EX. 1 | 170 | 0 | 2.8 | 19 | 46 |
| COMP. EX. 2 | 180 | 0 | 2.8 | 18 | 46 |
| COMP. EX. 3 | 190 | 0 | 2.8 | 16 | 47 |
| COMP. EX. 4 | 390 | 115 | 2.3 | 10 | 75 |
| COMP. EX. 5 | 400 | 128 | 2.3 | 10 | 76 |
| COMP. EX. 6 | None | — | 2.3 | 10 | 85 |

*The ratio of the cumulative illumination intensity of ultraviolet rays in the wavelength range not shorter than 320 nm to the cumulative illumination intensity of ultraviolet rays in the wavelength range not longer than 320 nm.

TABLE 2

| | C conc. in a film [atom %] | Contact angle of a film [°] | Effective specific dielectric constant | Production yield |
|---|---|---|---|---|
| EX. 1 | 7 | 98 | 2.7 | 94.7 |
| EX. 2 | 7 | 98 | 2.6 | 96.1 |
| EX. 3 | 8 | 98 | 2.7 | 96.1 |
| EX. 4 | 8 | 98 | 2.7 | 94.7 |
| EX. 5 | 8 | 98 | 2.7 | 94.7 |
| EX. 6 | 8 | 98 | 2.6 | 96.1 |
| EX. 7 | 8 | 98 | 2.7 | 96.1 |
| COMP. EX. 1 | 2 | 61 | 3.2 | 51.1 |
| COMP. EX. 2 | 3 | 63 | 3.2 | 57.6 |
| COMP. EX. 3 | 3 | 63 | 3.1 | 57.6 |
| COMP. EX. 4 | 8 | 98 | 2.7 | 96.1 |
| COMP. EX. 5 | 8 | 98 | 2.7 | 96.1 |
| COMP. EX. 6 | 8 | 98 | 2.6 | 94.7 |

TABLE 3

| | UV wavelength [nm] | Ratio of cum. int. (%)* | Specific dielectric constant | Film strength [GPa] | Si—CH$_3$ absorption intensity [/mm] |
|---|---|---|---|---|---|
| EX. 8 | 220 | 13 | 2.4 | 16 | 50 |
| EX. 9 | 260 | 22 | 2.3 | 15 | 50 |
| EX. 10 | 260 | 43 | 2.3 | 16 | 52 |
| EX. 11 | 260 | 66 | 2.3 | 16 | 51 |
| EX. 12 | 260 | 135 | 2.3 | 15 | 52 |
| EX. 13 | 300 | 24 | 2.3 | 15 | 53 |
| EX. 14 | 260 | 141 | 2.3 | 16 | 51 |
| EX. 15 | 260 | 185 | 2.3 | 15 | 50 |
| EX. 16 | 260 | 204 | 2.3 | 15 | 54 |
| EX. 17 | 400 | 334 | 2.3 | 10 | 76 |

*The ratio of the cumulative illumination intensity of ultraviolet rays in the wavelength range not shorter than 320 nm to the cumulative illumination intensity of ultraviolet rays in the wavelength range not longer than 320 nm.

TABLE 4

|  | C conc. in a film [atom %] | Contact angle of a film [°] | Effective specific dielectric constant | Production yield |
|---|---|---|---|---|
| EX. 8 | 7 | 98 | 2.7 | 94.7 |
| EX. 9 | 8 | 98 | 2.6 | 94.7 |
| EX. 10 | 7 | 98 | 2.6 | 96.1 |
| EX. 11 | 7 | 98 | 2.7 | 96.1 |
| EX. 12 | 8 | 98 | 2.7 | 94.7 |
| EX. 13 | 8 | 98 | 2.7 | 94.7 |
| EX. 14 | 8 | 98 | 2.6 | 71.1 |
| EX. 15 | 7 | 98 | 2.7 | 61.5 |
| EX. 16 | 7 | 98 | 2.6 | 51.1 |
| EX. 17 | 8 | 98 | 2.7 | 57.6 |

What is claimed is:

1. A method for manufacturing a semiconductor device, comprising forming an insulator film comprising a material having Si—CH$_3$ bond and Si—OH bond over a substrate, irradiating said insulator film with ultraviolet rays under a condition of generating Si—CH$_2$—CH$_2$—Si bond and Si—CH$_2$—Si bond by ultraviolet ray irradiation in the insulator film so that a modified insulator film is formed from said insulator film, wherein said irradiating of the ultraviolet rays is done through a filter, and wherein the ultraviolet rays that have passed through the filter have a cumulative illumination intensity in the longer wavelength range not shorter than 320 nm that is not more than 136% of a cumulative illumination intensity in the wavelength range not longer than 320 nm, and the ultraviolet rays have at least one peak in the range not longer than 320 nm.

2. A method for manufacturing a semiconductor device according to claim 1, comprising forming an Si—O—Si bond by said ultraviolet ray irradiation in the modified insulator film.

3. A method for manufacturing a semiconductor device according to claim 1, comprising performing heat treatment at a temperature in the range of 50-470° C. during said ultraviolet ray irradiation.

4. A method for manufacturing a semiconductor device according to claim 1, comprising performing said ultraviolet ray irradiation after another insulator film has been formed over said insulator film through which ultraviolet rays can pass to reach said insulator film.

5. A method for manufacturing a semiconductor device according to claim 1, comprising, after said insulator film has been formed, forming another insulator film over said insulator film, said another insulator film allowing said ultraviolet rays to pass to reach said insulator film.

6. A method for manufacturing a semiconductor device according to claim 5, comprising heating said insulator film before forming said another insulator film.

7. A method for manufacturing a semiconductor device according to claim 5, wherein said forming of said modified insulator film comprises irradiating said insulator film and said another insulator film with said ultraviolet rays.

8. A method for manufacturing a semiconductor device according to claim 1, wherein said ultraviolet rays have at least one of peaks in the neighborhood of 220, 260, 280, and 300 nm.

9. A method for manufacturing a semiconductor device according to claim 1, wherein said modified insulator film has a specific dielectric constant of not more than 2.4, and a film strength of not less than 14 GPa.

* * * * *